United States Patent [19]

Dahm et al.

[11] Patent Number: 5,431,778
[45] Date of Patent: Jul. 11, 1995

[54] DRY ETCH METHOD USING NON-HALOCARBON SOURCE GASES

[75] Inventors: Jonathan C. Dahm, Austin, Tex.; Gregory E. Bartlett, Phoenix, Ariz.; Gregory Ferguson, Austin, Tex.

[73] Assignee: Motorola, Inc., Schaumburg, Ill.

[21] Appl. No.: 190,965

[22] Filed: Feb. 3, 1994

[51] Int. Cl.⁶ ............................................... H01L 21/00
[52] U.S. Cl. ................................................ 156/662.1
[58] Field of Search ................ 156/643, 646, 662, 657

[56] References Cited

U.S. PATENT DOCUMENTS 4,807,016 2/1989 Douglas ............................ 156/643
5,122,225 6/1992 Douglas ............................ 156/643

FOREIGN PATENT DOCUMENTS 60-066823 4/1985 Japan.
62-130543 6/1987 Japan.
4-157721  5/1992 Japan.

OTHER PUBLICATIONS

Nordine, et al.; "Chemiluminescent Titration of F(g) with Cl2(g) and Microwave Production of Atomic Fluorine;" Journal of Chemical Soc. Faraday Trans. I 72(7), pp. 1526–1533 (1976).

Nordine, et al.; "Kinetics of the F,F2/Gd(s,v) Reactions;" Amer. Soc. for Metals and The Metallurgical Socieity of AIME/Metallurgical Trans. A; vol. 14A; pp. 53–60 (1983).

Flamm, et al.; "Reaction of fluorine atoms with SiO2; J. Appl. Phys."; vol. 50; No. 10; pp. 6211–6213 (1979).

*Primary Examiner*—R. Bruce Breneman
*Assistant Examiner*—George Goudreau
*Attorney, Agent, or Firm*—Patricia S. Goddard

[57] ABSTRACT

A layer of material (14) comprising silicon, such as an $SiO_2$ layer, overlying a silicon substrate (12) of a semiconductor device (10), is dry etched without the need for traditional halocarbon gases (such as $CHF_3$, $CF_4$, and $C_2F_6$) which are known green-house gases. A fluorine source, for producing the active fluorine radicals needed to etch silicon, is selected from either HF or $F_2$ gases. A carbon-oxygen source, for providing and stabilizing polymer build-up in the reactor, is selected from either CO or $CO_2$. An additional hydrogen source may be added as needed.

17 Claims, 1 Drawing Sheet

DRY ETCH METHOD USING NON-HALOCARBON SOURCE GASES

FIELD OF THE INVENTION

The present invention relates to methods for dry etching which employ non-halocarbon compounds, and particularly to such methods as used in the fabrication of semiconductor devices.

BACKGROUND OF THE INVENTION

In semiconductor manufacturing, dry etch chemistries used for etching layers comprising silicon (such as a single crystal silicon, polysilicon, silicon dioxide, and silicon nitride) typically employ halogenated hydrocarbons (also known as halocarbons) as source gases. Common gases used to etch such silicon layers include $CF_4$, $C_2F_6$, or $CHF_3$. These halocarbons are usually accompanied by oxygen or oxygen containing gases to achieve the appropriate chemical reactions to etch the silicon layer.

A concern in using halogenated hydrocarbons is that these gases have been implicated as a potential cause of global warming. During the dry etch process, a plasma generated within the etcher destroys or breaks down only a small fraction of the hydrocarbon source gases, leaving the rest to be vented into the earth's atmosphere.

Due to a growing concern for the environment and the potential problems of continued use of hydrocarbon source gases in semiconductor manufacturing, these gases may become scarce, more expensive, and/or heavily regulated by governmental agencies in an effort to discourage use. Therefore, semiconductor manufacturers would like to take the initiative to find alternative etch processes free from these environmental concerns.

One proposed solution to the problem halogenated hydrocarbon gases pose is the use of a post-etch exhaust gas treatment. In essence, such a treatment would be used to destroy any remaining halocarbon gases following the dry etch operation. There are various ways to destroy the dangerous gases, including hydrogen burn-off and molten elemental sodium treatment. In general, however, these abatement techniques are inefficient and expensive. Moreover, no catalytic destruct system yet exists.

Another proposed solution is the use of $NF_3$ as a source gas. $NF_3$ is a non-halocarbon gas which seems to adequately etch layers comprising silicon. Unfortunately, $NF_3$ gas also attacks most dry etch reactor vessels, resulting in corrosion of the vessel and contamination of the semiconductor devices being etched. Moreover, $NF_3$ gas is considerably more dangerous to handle than other gases used in semiconductor manufacturing.

SUMMARY OF THE INVENTION

In one form, the present invention pertains to dry etching a layer of a semiconductor device, wherein the layer comprises silicon. The layer is dry etched with a mixture of a carbon-oxygen source and a fluorine source. The carbon-oxygen source is selected from either CO or $CO_2$ while the fluorine source is selected from either HF or $F_2$.

Features and advantages of the present invention will be more clearly understood from the following detailed description taken in conjunction with the accompanying drawings.

DETAILED DESCRIPTION OF A PREFERRED EMBODIMENT

The present invention overcomes many of the environmental concerns of existing dry etch processes which utilize hydrogenated hydrocarbon source gas by mimicking the etch characteristics of a conventional fluorinated hydrocarbon and oxygen etch (e.g. $C_2F_6$ and $O_2$) by using elemental fluorine gas ($F_2$), oxygen ($O_2$), and either carbon dioxide ($CO_2$) or carbon monoxide (CO) gas. In the present invention, the fluorine gas becomes the source of the fluorine radicals in a dry plasma etch process. As in conventional dry etch processes, the fluorine radicals perform the etching of silicon by bonding to, and carrying off, silicon atoms from the layer being etched. The $CO_2$, CO, and oxygen gases of the present invention together form a controlled amount of hydrocarbon polymer which coats and protects the reaction vessel and components. In some embodiments of the present invention, other gases, such as methane ($CH_4$) or HF may also be used as a hydrogen source. Hydrogen sources are sometimes needed to achieve the desired etch selectivity between one material and another, and to control the etch rate and polymerization rate during the reaction. Furthermore, chlorine gas may be added as a source gas to mimic chlorofluorocarbons (CFCs) which at present are being phased out of most manufacturing operations due to a link between CFCs and atmospheric ozone destruction.

Figure 1:
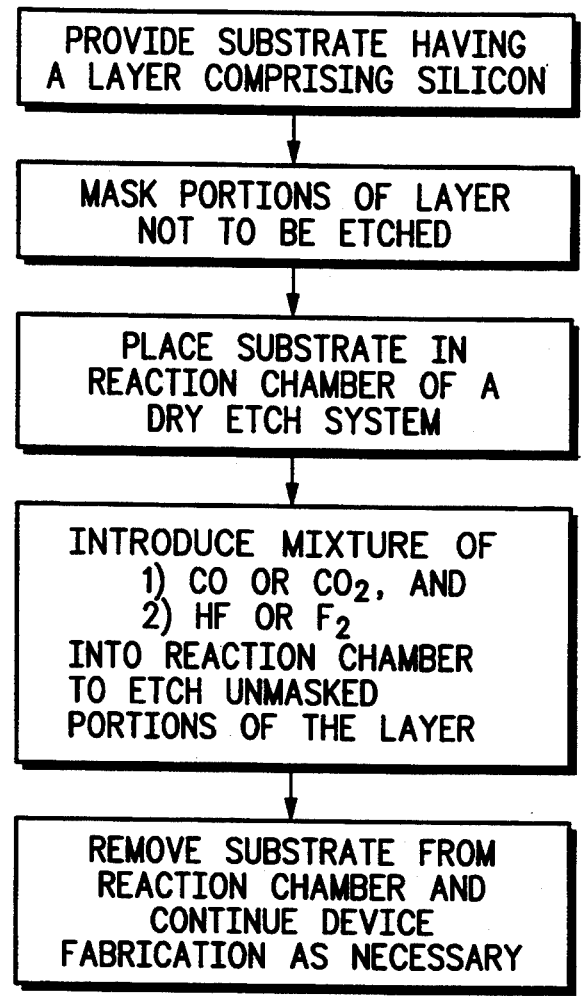
FIG. 1 is a flow chart in accordance with one embodiment of the present invention.
Figure 2:
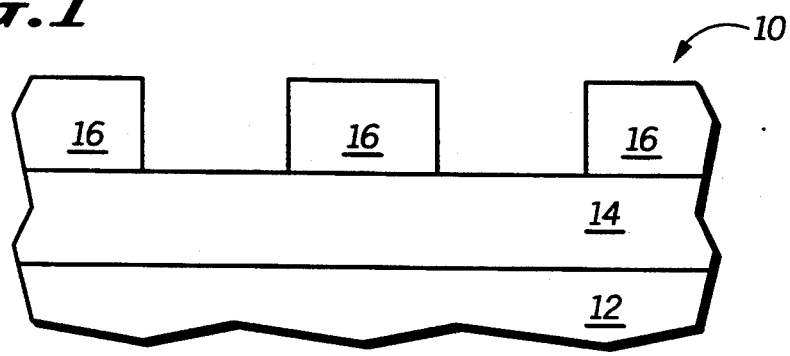
FIGS. 2-3 are partial cross-sectional views of a semiconductor device, as the device would appear before and after, respectively, a layer comprising silicon is etched in accordance with the present invention.
Figure 3:
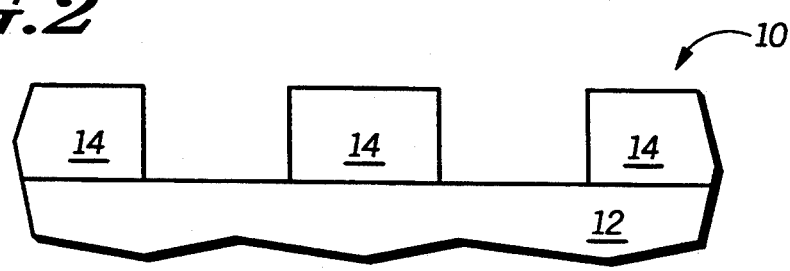

One application of the present invention is for etching materials of semiconductor devices which comprise silicon. One such embodiment of the present invention will be described in reference to FIGS. 1-3. FIG. 1 is a process flow for practicing one embodiment of the present invention, while FIGS. 2 and 3 illustrate, in cross-section, a portion of a semiconductor device 10 which is etched in accordance with the invention. Device 10 includes a substrate 12, and an overlying layer of material 14 which is to be etched into a desired pattern. Substrate 12 is typically a semiconductor wafer of silicon, gallium-arsenide, or other semiconducting material. However, outside of the semiconductor area, substrate 12 could be any material. Material 14 is the layer which is to be etched. In semiconductor applications, material 14 will likely be a material comprising, at least in part, silicon. For example, material 14 may be single crystal silicon, polysilicon, $SiO_2$, $Si_3N_4$, or the like. Moreover, the layer to be etched may itself be substrate 12 (for example if substrate 12 is a silicon wafer), in which case an additional layer of material 14 is unnecessary.

In etching material 14 in accordance with the present invention, a dissimilar material is used to mask or protect portions of material 14 which are not to be etched. For example, as illustrated in FIG. 2, a photoresist mask 16 is patterned over material 14 in accordance with conventional photoresist exposure, development, and etch techniques. It is important to note, however, that a mask is not necessary in practicing the invention. For example, material 14 may instead be uniformly etched backed without a mask using an etch process in accordance with the present invention.

Once mask 16, if used, is formed, device 10 is placed in a plasma or reactive ion etch (RIE) chamber. Commercially available plasma and RIE etchers are suitable for practicing the present invention, provided an appropriate number of source gas delivery lines is available. The pressure of the reaction chamber is maintained at about 1-10 mTorr if using an RIE system, while a suitable plasma etch chamber pressure may be as high as 2-10 Torr. Other equipment parameters are comparable to those used in existing methods which employ halogenated hydrocarbon source gases. In accordance the invention, source gases of $F_2$, $O_2$, and either CO or $CO_2$ are then introduced into the chamber. An RF energy source is used to create ionic and radical species of these gases within the chamber which etch portions of material 14 that are unprotected by mask 16. The ionic and radical species will strongly attack material 14 without substantially attacking mask 16. Fluorine species within the chamber are responsible for etching material 14. Carbon species within the chamber function to form a polymer which coats the reaction vessel, components, and the device 10, unless otherwise removed. Oxygen within the chamber controls the extent of polymer formation. The more oxygen present, the lesser the extent of polymer formation. If too much polymerization occurs, a heavy polymer coating within the vessel will lead to particulates which may contaminate the device. Furthermore, excessive polymeric build-up on the substrate 12 and other portions of device 10 may slow or even stop the etching of material 14. On the other hand, if insufficient polymerization occurs, the reaction vessel components may be attacked by fluorine species present within the chamber, also leading to particulate contamination of device 10 and degrading the vessel itself.

The gases continue to be delivered to the chamber until exposed portions of material 14 are removed or until a desired amount of the material being etched is removed. For example, as illustrated in FIG. 3, etching is accomplished until unmasked regions of material 14 are removed, thereby exposing underlying portions of substrate 12. After etching is complete, mask 16 is removed in a known manner, and device fabrication is completed in accordance with any of several known fabrication processes. Examples of subsequent processing steps may include dopant diffusion or ion implantation, polysilicon deposition, deposition of interlayer dielectrics, metal deposition, passivation deposition, and the like.

Specific examples of gas flows suitable for practicing the invention are included below, in comparison to some existing dry etch flow rates. It is important to note, however, that the present invention is not limited by these examples. In general the examples provided below are useful for etching $SiO_2$ or $Si_3N_4$ layers of semiconductor devices. One known dry plasma etch involves a gas mixture of 1000 sccm (standard cubic centimeters per minute) of $C_2F_6$ and 1000 sccm of $O_2$. A similar etch result can be accomplished by practicing the present invention using a gas mixture of 3000 sccm of $F_2$ and 2000 sccm of CO. Another known dry etch by low pressure RIE etch uses 80 sccm of $CHF_3$ and 40 sccm of $O_2$. This etch may be accomplished by the present invention using 80 sccm of $F_2$, 80 sccm of HF, and 80 sccm of CO. Yet another known low pressure RIE etch uses 80 sccm of $CHF_3$ and 30 sccm of $O_2$. The present invention may be used to replace this etch using 120 sccm of $F_2$, 20 sccm of $CH_4$, and 60 sccm of CO.

The foregoing description and illustrations contained herein demonstrate many of the advantages associated with the present invention. The present invention permits etching of conventional materials used in semiconductor manufacturing, particularly those materials containing silicon, without the use of hydrogenated halocarbons which destroy the earth's atmosphere. With the present invention, there is no need for destruction techniques to eliminate unreacted halocarbon gases since none of the source gases used in the present invention are themselves halocarbons. Also, the present invention is readily implemented using existing dry etch (either plasma or RIE) systems, and gases used in accordance with the present invention are now commercially available. Although handling fluorine gas may pose safety hazards, these hazards may be dealt with in much the same ways as existing hazardous gases currently used in semiconductor manufacturing. A further advantage of the present invention is that it is easily adapted from existing fluorine, carbon, and oxygen based dry etch processes since the same species are involved, but from different source gases.

Thus it is apparent that there has been provided, in accordance with the invention, a method for dry etching a material without the use of halocarbon gases that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, HF gas may be used in place of $F_2$ gas when a hydrogen source is desired. Hydrogen is sometimes used in dry etch processes to control selectivity, etch rates, and polymerization rates. Furthermore, a dry etch gas mixture in accordance with the invention might also include inert gases which do not take part in the etch, or other gases such a HCl. Similarly, more than two source gases may be used. For instance, $F_2$, HF or $CH_4$, and CO or $CO_2$. Also, it is important to note that the present invention can be used at any stage of semiconductor device fabrication, not just at the initial layer of material 14 on substrate 12 as illustrated in FIGS. 2 and 3. Therefore, it is intended that this invention encompass all such variations and modifications as fall within the scope of the appended claims.

We claim:

1. A method for making a semiconductor device having a layer comprising silicon, the method comprising the step of:

dry etching the layer with a mixture of a carbon-oxygen source gas and a fluorine source gas;

wherein the carbon-oxygen source gas is selected from a group consisting of CO and $CO_2$;

wherein the fluorine source gas is selected from a group consisting of HF and $F_2$; and wherein the etching is performed without use of any halogenated hydrocarbon source gases.

2. The method of claim 1 wherein the step of dry etching the layer comprises dry etching a layer comprising $SiO_2$.

3. The method of claim 1 wherein the step of dry etching comprises dry etching in a plasma etch system.

4. The method of claim 1 wherein the step of dry etching comprises dry etching in a reactive ion etch system.

5. The method of claim 1 wherein only two source gases are used to etch the layer.

6. The method of claim 1 wherein the mixture further comprises a hydrogen source gas.

7. A method for dry etching a layer of a semiconductor device, comprising the steps of:
provicing a semiconductor substrate;
forming the layer overlaying the substrate; and
etching the layer by exposing the layer to a mixture comprising a first gas and a second gas, wherein the first gas is selected from a group consisting of CO and $CO_2$ and the second gas is selected from a group consisting of HF and $F_2$, and wherein the mixture is free of any halogenated hydrocarbon source gases.

8. The method of claim 7 wherein the step of forming the layer comprises forming a layer comprising $SiO_2$.

9. The method of claim 8 wherein the step of etching comprises exposing the layer to a mixture comprising $F_2$ and CO.

10. The method of claim 7 wherein the step of forming the layer comprises forming a polysilicon layer.

11. The method of claim 7 wherein the step of etching comprises exposing the layer to a mixture of only the first and second gases.

12. The method of claim 7 wherein the step of etching comprises exposing the layer to a mixture further comprising a third gas, wherein the third gas comprises hydrogen.

13. The method of claim 12 wherein the step of etching comprises exposing the layer to a mixture wherein the third gas comprises $CH_4$.

14. A method of dry etching a material comprising silicon, comprising the step of:
exposing the material to a mixture of only non-halocarbon source gases, wherein the mixture comprises $F_2$ and one of either CO or $CO_2$.

15. The method of claim 14 wherein the step of exposing comprises exposing the material to a mixture wherein the mixture further comprises HF.

16. The method of claim 14 wherein the step of exposing comprises exposing the material to a mixture wherein the mixture further comprises $CH_4$.

17. The method of claim 14 wherein the material comprises a material selected from a group consisting of $SiO_2$, $Si_3N_4$, polysilicon, and single crystal silicon.

* * * * *